(12) United States Patent
Howald et al.

(10) Patent No.: US 10,296,676 B2
(45) Date of Patent: *May 21, 2019

(54) SYSTEMS AND METHODS FOR TUNING AN IMPEDANCE MATCHING NETWORK IN A STEP-WISE FASHION

(71) Applicant: Lam Research Corporation, Fremont, CA (US)

(72) Inventors: Arthur M. Howald, Livermore, CA (US); John C. Valcore, Jr., Fremont, CA (US); Andrew Fong, Pleasanton, CA (US); David Hopkins, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 485 days.

This patent is subject to a terminal disclaimer.

(21) Appl. No.: 15/061,705

(22) Filed: Mar. 4, 2016

(65) Prior Publication Data
US 2016/0259872 A1    Sep. 8, 2016

Related U.S. Application Data

(63) Continuation-in-part of application No. 14/245,803, filed on Apr. 4, 2014, now Pat. No. 9,779,196.

(60) Provisional application No. 61/821,523, filed on May 9, 2013.

(51) Int. Cl.
*G06F 17/11* (2006.01)
*G06F 17/50* (2006.01)

(52) U.S. Cl.
CPC .......... *G06F 17/5009* (2013.01); *G06F 17/11* (2013.01); *G06F 17/5063* (2013.01); *G06F 2217/16* (2013.01)

(58) Field of Classification Search
None
See application file for complete search history.

(56) References Cited

U.S. PATENT DOCUMENTS

| | | | |
|---|---|---|---|
| 5,187,454 A | 2/1993 | Collins et al. | |
| 6,259,334 B1* | 7/2001 | Howald | H01J 37/32183 315/111.21 |
| 7,326,872 B2* | 2/2008 | Shannon | H01P 5/08 |
| 2014/0214395 A1 | 7/2014 | Valcore, Jr. et al. | |

* cited by examiner

*Primary Examiner* — Roy Y Yi
(74) *Attorney, Agent, or Firm* — Penilla IP, APC

(57) ABSTRACT

Systems and methods for tuning an impedance matching network in a step-wise fashion are described. By tuning the impedance matching network in a step-wise fashion instead of directly to achieve optimum values of a radio frequency (RF) and a combined variable capacitance, processing of a wafer using the tuned optimal values becomes feasible.

21 Claims, 10 Drawing Sheets

SYSTEMS AND METHODS FOR TUNING AN IMPEDANCE MATCHING NETWORK IN A STEP-WISE FASHION

CLAIM OF PRIORITY

This application is a continuation-in-part of and claims the benefit, under 35 U.S.C. § 120, of co-pending U.S. patent application Ser. No. 14/245,803, filed on Apr. 4, 2014, and entitled "SEGMENTING A MODEL WITHIN A PLASMA SYSTEM", which is incorporated by reference herein in its entirety.

The U.S. patent application Ser. No. 14/245,803, filed on Apr. 4, 2014, and titled "SEGMENTING A MODEL WITHIN A PLASMA SYSTEM", claims priority, under 35 U.S.C. § 119(e), to U.S. provisional patent application No. 61/821,523, filed on May 9, 2013, and titled "SEGMENTING A MODEL WITHIN A PLASMA SYSTEM".

FIELD

The present embodiments relate to systems and methods for tuning an impedance matching network in a step-wise fashion.

BACKGROUND

Plasma systems are used to control plasma processes. A plasma system includes multiple radio frequency (RF) sources, an impedance match, and a plasma reactor. A workpiece is placed inside the plasma chamber and plasma is generated within the plasma chamber to process the workpiece. It is important that the workpiece be processed in a similar or uniform manner. To process the workpiece in a similar or uniform manner, it is important that the RF sources and the impedance match be tuned.

It is in this context that embodiments described in the present disclosure arise.

SUMMARY

Embodiments of the disclosure provide apparatus, methods and computer programs for tuning an impedance matching network in a step-wise fashion. It should be appreciated that the present embodiments can be implemented in numerous ways, e.g., a process, an apparatus, a system, a piece of hardware, or a method on a computer-readable medium. Several embodiments are described below.

A plasma tool has a radio frequency (RF) matching network tune algorithm. The plasma tool has one or two RF generators, and each RF generator is connected to a 50 ohm coaxial RF cable. The RF cables are connected to an impedance matching network, which is connected via an RF transmission line to a plasma chamber. The RF generators are designed to operate with load impedances of 50+0 j ohms, or near 50+0 j ohms. One purpose of the impedance matching network is to transform a load impedance of the plasma chamber and the RF transmission line, which is typically not near 50+0 j Ohms, to at or near 50+0 j Ohms. The target impedance of at or near 50+0 j Ohms has two parts, a real part, which should be at or near 50 ohms, and an imaginary part, which should be at or near 0 ohms. A branch circuit of the impedance matching network that is connected to one of the two RF generators, therefore, has two variable elements. The two variable elements include one motor-driven variable capacitance and a variable RF frequency output from the one of the RF generators.

The variable capacitance is set in advance in a recipe and does not vary within a recipe step. The variable capacitance is changed by editing the recipe. The variable RF frequency is controlled by a process running internally within the RF generator. The process operates according to a voltage reflection coefficient. If the reflection coefficient is high, relative to a threshold value, the process increases or decreases the RF frequency, and in this manner, changes the RF frequency in one direction or the other based on the reflection coefficient. A sensor in the RF generator detects a reflected voltage using a narrow-band filter and detects a part of the reflected voltage at the fundamental frequency, while there can exist large reflected wave amplitudes at intermodulation frequencies, which are not detected. A match network model for the impedance matching network is used to predict an RF voltage, a current, and a phase between the RF voltage and the current or a load impedance at an output of the impedance matching network when the following inputs, e.g., RF power, values of the variable capacitance and the variable RF frequency, and a measured value of RF load impedance at an output of the RF generator, etc., are provided as inputs to the match network model. The match network model is extended to predict an RF voltage and current between the output of the impedance matching network and a chuck. In various embodiments, the match network model includes a series of modules which all have the same form, as is described in the patent application having application Ser. No. 14/245,803.

In some embodiments, the load impedance at the output of the RF generator is forward propagated via the match network model to calculate a load impedance at an output of the match network model from the variable capacitance and the variable RF frequency, and the load impedance at the output is then back propagated to determine optimum values for the variable capacitance and variable RF frequency. Upon determining the optimum values, the RF generator and the impedance matching network are tuned to achieve the optimum values of the variable capacitance and the RF variable frequency. The variable RF frequency can be varied much more quickly to achieve the optimal value of the variable RF frequency than the variable capacitance can be varied to achieve the optimal value of the variable capacitance. For example, the variable RF frequency is varied on the order of a microsecond as compared to on the order of a second for varying the variable capacitance. So, it is difficult to directly set the RF generator to operate at the optimum value of the variable RF frequency and set the impedance matching network to operate at the optimum value of the variable capacitance. For tuning the impedance matching network, instead of tuning the impedance matching network to achieve the optimum value of the variable capacitance and tuning the RF generator to achieve the optimum value of the variable RF frequency, the impedance matching network is tuned in a stepwise fashion to generate a step variable capacitance value instead of the optimal value of the variable capacitance and a local optimal value of the variable RF frequency for the step variable capacitance is calculated. For example, the impedance matching network is tuned to have a value of the variable capacitance that is in a direction of the optimum value of the variable capacitance and the local optimal value of the variable RF frequency determined for the value of the variable capacitance. In such a manner, the optimal value of the variable capacitance and the optimal value of the variable RF frequency achieved instead of directly achieving directly the optimal value of the variable capacitance and the optimal value of the variable RF frequency.

Some advantages of the herein described systems and methods include applying the step-wise fashion in which to tune the variable capacitance of the impedance matching network. In the step-wise fashion, the local optimum value of the variable RF frequency for which a reflection coefficient at an input of the match network model is minimum is calculated for a step value of the variable capacitance. The step value is then incremented and another value of the variable RF frequency for which a reflection coefficient at the input of the match network model is minimum is calculated for the incremented step value of the variable capacitance. The step value is incremented until the optimum value of the variable capacitance is reached. It is difficult to achieve the optimum value of the variable capacitance directly from a value at which the impedance matching network is operating at the same time the optimal value of the variable RF frequency is achieved. This is because it is difficult to control one or more variable capacitors of the impedance matching network with the same speed as that of controlling the RF generator. By using the step-wise fashion, the optimal values of the variable capacitance and of the RF frequency are achieved.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

DETAILED DESCRIPTION

The following embodiments describe systems and methods for tuning an impedance matching network in a step-wise fashion. It will be apparent that the present embodiments may be practiced without some or all of these specific details. In other instances, well known process operations have not been described in detail in order not to unnecessarily obscure the present embodiments.

Figure 1:
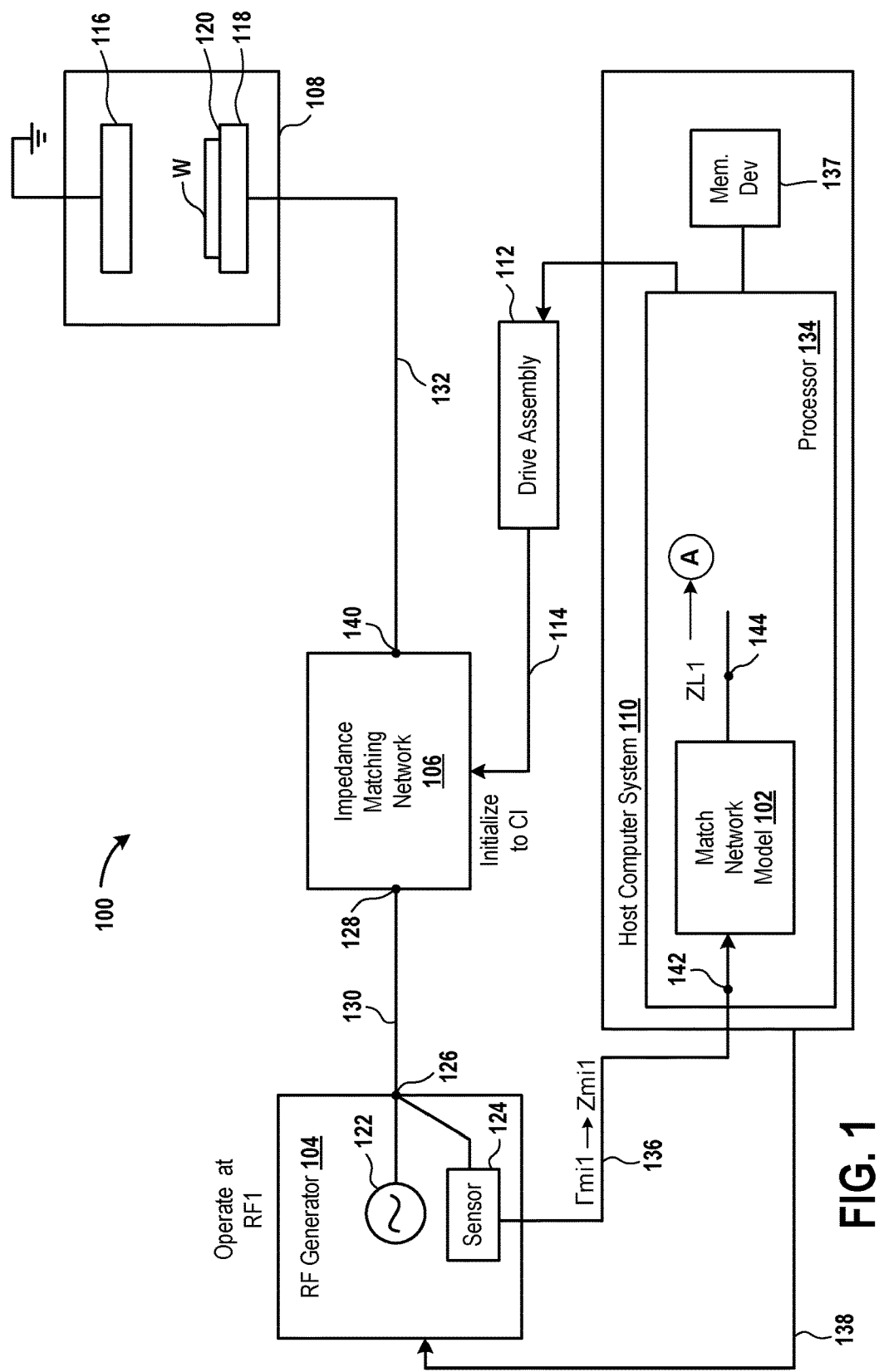
FIG. 1 is a diagram of an embodiment of a plasma system to illustrate generation of a load impedance ZL1 using a match network model.

FIG. 1 is a diagram of an embodiment of a plasma system 100 to illustrate generation of a load impedance ZL1 using a match network model 102. The plasma system 100 includes a radio frequency (RF) generator 104, an impedance matching network 106, and a plasma chamber 108. The plasma system 100 includes a host computer system 110, a drive assembly 112, and one or more connection mechanisms 114.

The plasma chamber 108 includes an upper electrode 116, a chuck 118, and a wafer W. The upper electrode 116 faces the chuck 118 and is grounded, e.g., coupled to a reference voltage, coupled to zero voltage, coupled to a negative voltage, etc. Examples of the chuck 118 include an electrostatic chuck (ESC) and a magnetic chuck. A lower electrode of the chuck 118 is made of a metal, e.g., anodized aluminum, alloy of aluminum, etc. In various embodiments, the lower electrode of the chuck 118 is a thin layer of metal that is covered by a layer of ceramic. Also, the upper electrode 116 is made of a metal, e.g., aluminum, alloy of aluminum, etc. In some embodiments, the upper electrode 116 is made from silicon. The upper electrode 116 is located opposite to and facing the lower electrode of the chuck 118. The wafer W is placed on a top surface 120 of the chuck 118 for processing, e.g., depositing materials on the wafer W, or cleaning the wafer W, or etching layers deposited on the wafer W, or doping the wafer W, or implantation of ions on the wafer W, or creating a photolithographic pattern on the wafer W, or etching the wafer W, or sputtering the wafer W, or a combination thereof.

In some embodiments, the plasma chamber 108 is formed using additional parts, e.g., an upper electrode extension that surrounds the upper electrode 116, a lower electrode extension that surrounds the lower electrode of the chuck 118, a dielectric ring between the upper electrode 116 and the upper electrode extension, a dielectric ring between the lower electrode and the lower electrode extension, confinement rings located at edges of the upper electrode 116 and the chuck 118 to surround a region within the plasma chamber 108 in which plasma is formed, etc.

The impedance matching network 106 includes one or more circuit components, e.g., one or more inductors, or one or more capacitors, or one or more resistors, or a combination or two or more thereof, etc., which are coupled with each other. For example, the impedance matching network 106 includes a series circuit that includes an inductor coupled in series with a capacitor. The impedance matching network 106 further includes a shunt circuit connected to the series circuit. The shunt circuit includes a capacitor connected in series with an inductor. The impedance matching network 106 includes one or more capacitors and corresponding capacitances of the one or more capacitors, e.g., all variable capacitors, etc., are variable, e.g., are varied using a drive assembly, etc. The impedance matching network 106 includes one or more capacitors that have fixed capacitances, e.g., which cannot be changed using the drive assembly 112, etc. A combined variable capacitance of the one or more variable capacitors of the impedance matching network 106 is a value C1. For example, corresponding oppositely-located plates of the one or more variable capacitors are adjusted to be at a fixed position to set the variable capacitance C1. To illustrate, the combined capacitance of two or more capacitors that are connected to each other in parallel is a sum of capacitances of the capacitors. As another illustration, the combined capacitance of two or more capacitors that are connected to each other in series is an inverse of a sum of inverses of capacitances of the capacitors. An example of an impedance matching network 106 is provided in the patent application having application Ser. No. 14/245,803.

The match network model 102 is derived from e.g., represents, etc., a branch of the impedance matching network 106. For example, when the x MHz RF generator is connected to the branch circuit of the impedance matching network 106, the match network model 102 represents, e.g., is a computer-generated model of, etc., the circuit of the branch circuit of the impedance matching network 106. As another example, the match network model 102 does not have the same number of circuit components as that of the impedance matching network 106. In some embodiments, the match network model 102 has a lower number of circuit elements than a number of circuit components of the impedance matching network 106. To illustrate, the match network model 102 is a simplified form of the branch circuit of the impedance matching network 106. To further illustrate, variable capacitances of multiple variable capacitors of the branch circuit of the impedance matching network 106 are combined into a combined variable capacitance represented by one or more variable capacitive elements of the match network model 102, fixed capacitances of multiple fixed capacitors of the branch circuit of the impedance matching network 106 are combined into a combined fixed capacitance represented by one or more fixed capacitive elements of the match network model 102, and/or inductances of multiple fixed inductors of the branch circuit of the impedance matching network 106 are combined into a combined inductance represented by one or more inductive elements of the match network model 102, and/or resistances of multiple resistors of the branch circuit of the impedance matching network 106 are combined into a fixed resistance represented by one or more of resistive elements of the match network model 102. To illustrate more, capacitances of capacitors that are in series are combined by inverting each of the capacitances to generate multiple inverted capacitances, summing the inverted capacitances to generate an inverted combined capacitance, and by inverting the inverted combined capacitance to generate a combined capacitance. As another illustration, multiple inductances of inductors that are connected in series are summed to generate a combined inductance and multiple resistances of resistors that are in series are combined to generate a combined resistance. All fixed capacitances of all fixed capacitors of the portion of the impedance matching network 106 are combined into a combined fixed capacitance of one or more fixed capacitive elements of the match network model 102. Other examples of the match network model 102 are provided in the patent application having application Ser. No. 14/245,803. Also, a manner of generating a match network model from an impedance matching network is described in the patent application having application Ser. No. 14/245,803.

In some embodiments, the match network model 102 is generated from a schematic for the impedance matching network 106 that has three branches, one each for x MHz, y MHz, and z MHz RF generators. The three branches join each other at the output 140 of the impedance matching network 106. The schematic initially includes a number of inductors and capacitors in various combinations. For one of the three branches considered individually, the match network model 102 represents one of the three branches. Circuit elements are added to the match network model 102 via an input device, examples of which are provided below. Examples of circuit elements added include resistors, not previously included in the schematic, to account for power losses in the branch of the impedance matching network 106, inductors, not previously included in the schematic, to represent an inductance of various connecting RF straps, and capacitors, not previously included in the schematic, to represent parasitic capacitances. Moreover, some circuit elements are further added to the schematic via the input device to represent a transmission line nature of the branch of the impedance matching network 106 because of physical dimensions of the impedance matching network 106. For example, an uncoiled length of one or more inductors in the branch of the impedance matching network 106 is not negligible compared to a wavelength of an RF signal passing via the one or more inductors. To account for this effect, an inductor in the schematic is divided into 2 or more inductors. Thereafter, some circuit elements are removed via the input device from the schematic to generate the match network model 102.

In various embodiments, the match network model 102 has the same topology, e.g., connections between circuit elements, number of circuit elements, etc., as that of the branch circuit of the impedance matching network 106. For example, if the branch circuit of the impedance matching network 106 includes a capacitor coupled in series with an inductor, the match network model 102 includes a capacitor coupled in series with an inductor. In this example, the inductors of the branch circuit of the impedance matching network 106 and of the match network model 102 have the same value and the capacitors of the branch circuit of the impedance matching network 106 and of the match network model 102 have the same value. As another example, if the branch circuit of the impedance matching network 106 includes a capacitor coupled in parallel with an inductor, the match network model 102 includes a capacitor coupled in parallel with an inductor. In this example, the inductors of the branch circuit of the impedance matching network 106 and of the match network model 102 have the same value and the capacitors of the branch circuit of the impedance matching network 106 and of the match network model 102 have the same value. As another example, the match network model 102 has the same number and same types of circuit elements as that of circuit components of the impedance matching network 106 and has the same type of connections between the circuit elements as that between the circuit components. Examples of types of circuit elements include resistors, inductors, and capacitors. Examples of type of connections include serial, parallel, etc.

Moreover, the RF generator 104 includes an RF power supply 122 for generating an RF signal. The RF generator 104 includes a sensor 124, e.g., a complex impedance sensor, a complex current and voltage sensor, a complex reflection coefficient sensor, a complex voltage sensor, a complex current sensor, etc., that is connected to an output 126 of the RF generator 104. The output 126 is connected to an input 128 of the branch circuit of the impedance matching network 106 via an RF cable 130. The impedance matching network 106 is connected to the plasma chamber 108 via an RF transmission line 132, which includes an RF rod and an RF outer conductor that surrounds the RF rod.

The drive assembly 112 includes a driver, e.g., one or more transistors, etc., and a motor, and the motor is connected via the connection mechanism 114 to a variable capacitor of the impedance matching network 106. Examples of the connection mechanism 114 include one or more rods, or rods that are connected to each other via a gear, etc. The connection mechanism 114 is connected to a variable capacitor of the impedance matching network 106. For example, the connection mechanism 114 is connected to a variable capacitor that is a part of the branch circuit that is connected to the RF generator 104 via the input 128.

It should be noted that in case the impedance matching network 106 includes more than one variable capacitor in the branch circuit that is connected to the RF generator 104, the drive assembly 112 includes separate motors for controlling the more than one variable capacitor, and each of the motor is connected via a corresponding connection mechanism to the corresponding variable capacitor. In this case, the multiple connection mechanisms are referred to as the connection mechanism 114.

The RF generator 104 is an x megahertz (MHz) RF generator or a y MHz RF generator or a z MHz RF generator. In some embodiments, an example of the x MHz RF generator includes a 2 MHz RF generator, an example of the y MHz RF generator includes a 27 MHz RF generator, and an example of the z MHz RF generator includes a 60 MHz RF generator. In various embodiments, an example of the x MHz RF generator includes a 400 kHz RF generator, an example of the y MHz RF generator includes a 27 MHz RF generator, and an example of the z MHz RF generator includes a 60 MHz RF generator.

It should be noted that in case two RF generators, e.g., the x and y MHz RF generators, etc., are used in the plasma system 100, one of the two RF generators is connected to the input 128 and another one of the RF generators is connected to another input of the impedance matching network 106. Similarly, in case three RF generators, e.g., the x, y, and z MHz RF generators, etc., are used in the chamber system 100, a first one of the RF generators is connected to the input 128, a second one of the RF generators is connected to a second input of the impedance matching network 106, and a third one of the RF generators is connected to a third input of the impedance matching network 106. The output 140 is connected to the input 128 via the branch circuit of the impedance matching network 106. In the embodiments in which multiple RF generators are used, the output 140 is connected to the second input via a second branch circuit of the impedance matching network 106 and the output 140 is connected to the third input via a third branch circuit of the impedance matching network 106.

The host computer system 110 includes a processor 134 and a memory device 137. Examples of the host computer system 110 include a laptop computer or a desktop computer or a tablet or a smart phone, etc. As used herein, instead of the processor, a central processing unit (CPU), a controller, an application specific integrated circuit (ASIC), or a programmable logic device (PLD) is used, and these terms are used interchangeably herein. Examples of a memory device include a read-only memory (ROM), a random access memory (RAM), a hard disk, a volatile memory, a non-volatile memory, a redundant array of storage disks, a Flash memory, etc. The sensor 124 is connected to the host computer system 110 via a network cable 136. Examples of a network cable, as used herein, is a cable used to transfer data in a serial manner, or in a parallel manner, or using a USB protocol, etc.

The RF generator 104 is operated at a radio frequency RF1. For example, the processor 134 provides a recipe that includes the radio frequency RF1 and a power value to the RF generator 104. The RF generator 104 receives the recipe via a network cable 138 that is connected to the RF generator 104 and the host computer system 110, and a digital signal processor (DSP) of the RF generator 104 provides the recipe to the RF power supply 122. The RF power supply 122 generates the RF signal that has the radio frequency RF1 and the power prescribed in the recipe.

The impedance matching network 106 is initialized to have the combined variable capacitance C1. For example, the processor 134 sends a signal to the driver of the drive assembly 112 to generate one or more current signals. The one or more current signals are generate by the driver and sent to corresponding one or more stators of corresponding one or more motors of the drive assembly 112. Corresponding one or more rotors of the drive assembly 112 rotate to move the connection mechanism 114 to change the combined variable capacitance of the branch circuit of the impedance matching network 106 to C1. The branch circuit of the impedance matching network 106 having the combined variable capacitance C1 receives the RF signal having the radio frequency RF1 from the output 126 via the input 128 and the RF cable 130 and matches an impedance of a load connected to the impedance matching network 106 with that of a source connected to the impedance matching network 106 to generate a modified signal, which is an RF signal. Examples of the load include the plasma chamber 108 and the RF transmission line 132. Examples of the source include the RF cable 130 and the RF generator 104. The modified signal is provided from an output 140 of the branch circuit of the impedance matching network 106 via the RF transmission line 132 to the chuck 118. When the modified signal is provided to the chuck 118 in conjunction with one or more process gases, e.g., oxygen containing gas, fluorine containing gas, etc., plasma is produced or is maintained in a gap between the chuck 118 and the upper electrode 116.

When the RF signal having the radio frequency RF1 is generated and the impedance matching network 106 has the combined variable capacitance C1, the sensor 124 senses a voltage reflection coefficient $\Gamma mi1$ at the output 126 and provides the voltage reflection coefficient via the network cable 136 to the processor 134. An example of a voltage reflection coefficient includes a ratio of power reflected towards the RF generator 104 from the plasma chamber 108 and power supplied within the RF signal generated by the RF generator 104. The processor 134 calculates an impedance $Zmi1$ from the voltage reflection coefficient $\Gamma mi1$. For example, the processor 134 calculates the impedance $Zmi1$ by applying an equation (1), which is $\Gamma mi1=(Zmi1-Zo)/(Zmi1+Zo)$, and solving for $Zmi1$, where $Zo$ is a characteristic impedance of the RF transmission line 132. The impedance $Zo$ is provided to the processor 134 via an input device, e.g., a mouse, a keyboard, a stylus, a keypad, a button, a touch screen, etc., that is connected to the processor 134 via an input/output interface, e.g., a serial interface, a parallel interface, a universal serial bus (USB) interface, etc. In some embodiments, the sensor 124 measures the impedance Zmi1 and provides the impedance Zmi1 via the network cable 136 to the processor 134.

The impedance Zmi1 is applied by the processor 134 to an input 142 of the match network model 102 and is forward propagated via the match network model 102 to calculate a load impedance ZL1 at an output 144 of the match network model 102. For example, the impedance Zmi1 is forward propagated by the processor 134 via one or more circuit elements of the match network model 102 to generate the load impedance ZL1. To illustrate, the match network model 102 is initialized to have the radio frequency RF1. When the match network model 102 includes a series combination of a resistive element, an inductive element, a fixed capacitive element, and a variable capacitive element, the processor 134 calculates a directional sum of the impedance Zmi1 received at the input 142 of the match network model 102, a complex impedance across the resistive element, a complex impedance across an inductive element, and a complex impedance across the variable capacitive element having the variable capacitance C1, and a complex impedance across the fixed capacitive element to generate the load impedance ZL1.

In some embodiments, the RF generator 104 operates in a continuous wave mode, which is not a pulsed wave mode. For example, the RF generator 104 does not have pulsed states S1 and S2, in which all power values of the RF signal in the state S2 are exclusive of power values of the RF signal in the state S2. The state S2 has power values that are lower than that of the state S1. As another example, in the continuous wave mode, there is an overlap of at least one power values in the state S1 with that of at least one power value in the state S2 to eliminate the difference between the states S1 and S2 to generate one state.

In various embodiments, instead of measuring a voltage reflection coefficient at the output 126, a voltage reflection coefficient is measured at any point, on the RF cable 130, from and including the output 126 to the input 128. For example, the sensor 124 is connected to the point between RF power supply 122 and the impedance matching network 106 to measure a voltage reflection coefficient.

Figure 2:
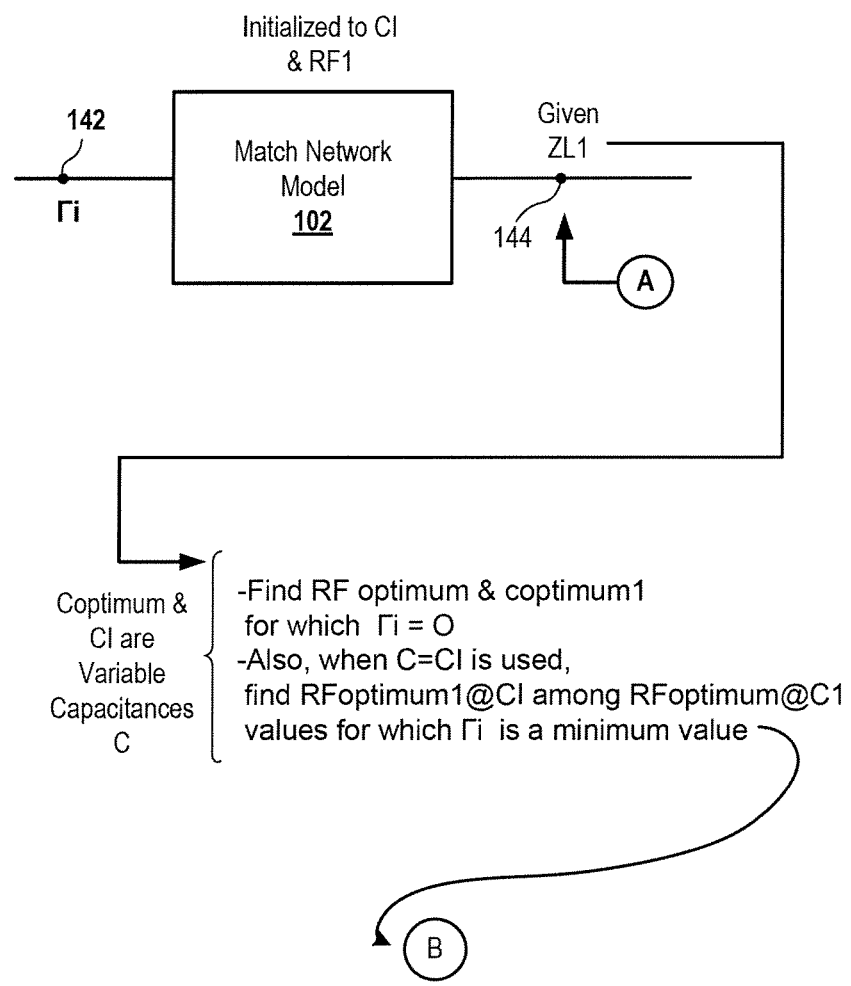
FIG. 2 is a diagram of an embodiment a match network model that is initialized to a radio frequency RF1 and a variable capacitance C1 to generate a reflection coefficient Γi at an input of the match network model.

FIG. 2 is a diagram of an embodiment of the match network model 102 that is initialized to the radio frequency RF1 and the variable capacitance C1 to generate a voltage reflection coefficient Γi at the input 142. The processor 134 calculates from the load impedance ZL1 and the match network model 102 a radio frequency value RFoptimum and a combined variable capacitance value Coptimum1 for which the voltage reflection coefficient Γi is zero. For example, the processor 134 back propagates the load impedance ZL1 via the match network model 102 to generate an input impedance Zi corresponding to the voltage reflection coefficient Γi having the zero value at the input 142. The back propagation is the same as the forward propagation except that the back propagation is in a direction opposite to the forward propagation. In some embodiments, a non-linear least squares optimization routine is executed by the processor 134 to calculate from the load impedance ZL1 and the match network model 102 the radio frequency value RFoptimum and the combined variable capacitance value Coptimum1 for which the voltage reflection coefficient Γi is zero. In various embodiments, pre-determined equations are applied by the processor 134 to calculate from the load impedance ZL1 and the match network model 102 the radio frequency value RFoptimum and the combined variable capacitance value Coptimum1 for which the voltage reflection coefficient Γi is zero.

Moreover, the processor 134 varies the radio frequency values applied to the match network model 102 from RFoptimum1 @C1 to RFoptimumn@C1 and back propagates the load impedance ZL1 to determine the radio frequency RFoptimum1 @C1 for which the voltage reflection coefficient Γi is a minimum, where n is an integer greater than 1. For example, the processor 134 back propagates the load impedance ZL1 via the match network model 102 having the variable capacitance C1 when the match network model 102 has the radio frequency RFoptimum1 @C1 to determine that the voltage reflection coefficient Γi has a first value. Moreover, in the example, the processor 134 back propagates the load impedance ZL1 via the match network model 102 having the variable capacitance C1 when the match network model 102 has the radio frequency RFoptimum2@C1 to determine that the voltage reflection coefficient Γi has a second value. The processor 134 determines that the first value is a minimum of the first and second values to further determine that the RFoptimum1@C1 is a radio frequency value for which the voltage reflection coefficient Γi is a minimum. In some embodiments, a non-linear squares optimization routine is used to find the radio frequency value RFoptimum1 @C1 for which the voltage reflection coefficient Γi has the minimum value.

In various embodiments, a value of the radio frequency for which the voltage reflection coefficient is at a minimum is referred to herein as at favorable RF value.

In some embodiments, an RF value is sometimes referred to herein as a "parametric value". Moreover, a capacitance is sometimes referred to herein as a "measurable factor".

Figure 3:
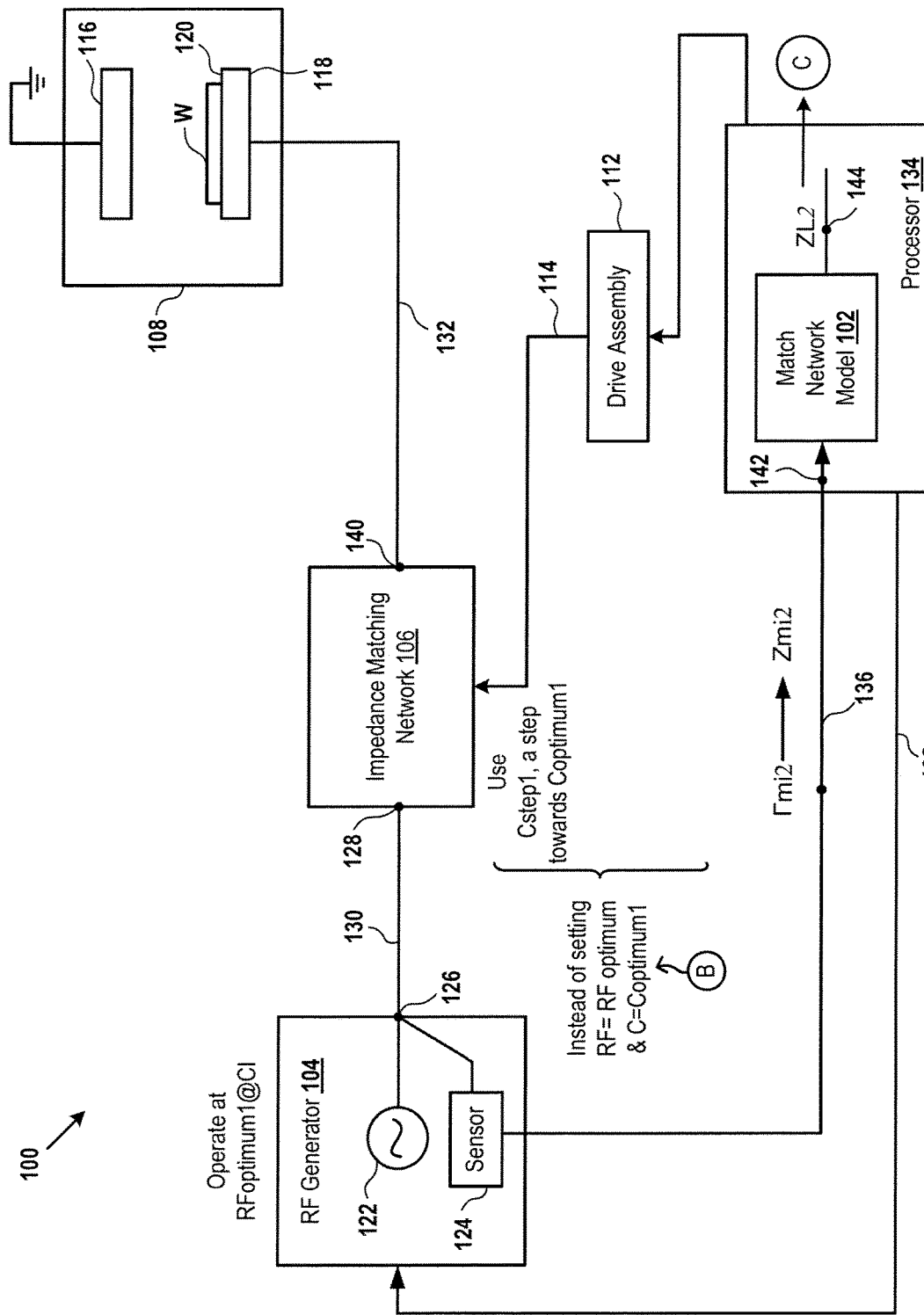
FIG. 3 is a diagram of an embodiment of the plasma system to illustrate use of a capacitance Coptimum1 to generate a step combined variable capacitance value Cstep1, and use of a value RFoptimum1@C1 to generate a load impedance ZL2.

FIG. 3 is a diagram of an embodiment of the plasma system 100 to illustrate use of the capacitance value Coptimum1 to generate a step combined variable capacitance value Cstep1, and use of the value RFoptimum1@C1 to generate a load impedance ZL2 at the output 144 of the match network model 102. The processor 134 modifies the recipe to include the radio frequency value RFoptimum1@C1 and provides the radio frequency value RFoptimum1@C1 to the RF generator 104. Moreover, the processor 134 determines the step variable capacitance value Cstep1 that is a step in a direction of the value Coptimum1 from the value C1. It should be noted that even if one or more capacitances of corresponding one or more variable capacitors of the impedance matching network 106 are modified to change from C1 towards Coptimum1, the one or more variable capacitors move slow enough relative to changes in an RF frequency of the RF signal generated by the RF generator 104.

Instead of setting the combined variable capacitance of the impedance matching network 106 at the value Coptimum1 and instead of setting the RF generator 104 to generate the RF signal having the radio frequency RFoptimum, the processor 134 controls the drive assembly 112 so that the combined variable capacitance of the impedance matching network 106 is set at the value Cstep1 and controls the RF generator 104 to operate at the radio frequency RFoptimum1 @C1. It takes a longer time, e.g., in an order of seconds, etc., for the impedance matching network 106 to achieve the variable capacitance Coptimum1 than that taken by the RF generator 104 to generate an RF signal having the radio frequency RFoptimum. For example, it takes in an order of microseconds for the RF generator 104 to achieve the radio frequency RFoptimum from the radio frequency RF1. As a result, it is difficult to directly achieve the value Coptimum1 from the value C1 simultaneous with achieving the value RFoptimum from the value RF1 so that the voltage reflection coefficient at the output 126 of the RF generator 104 is zero. Therefore, the variable capacitance of the impedance matching network 106 is adjusted in steps, e.g., Cstep1 etc., in a direction towards the variable capacitance Coptimum1.

For the radio frequency RFoptimum1@C1 and the variable capacitance Cstep1, the RF generator 104 generates the RF signal having the radio frequency RFoptimum1@C1, which passes via the impedance matching network 106 to generate a modified signal, which is provided to the lower electrode of the chuck 118. When the RF generator 104 generates the RF signal having the radio frequency RFoptimum1@C1 and the combined variable capacitance is Cstep1, the sensor 124 measures a voltage reflection coefficient Γmi2 at the output 126 and the processor 134 generates an impedance Zmi2 from the voltage reflection coefficient Γmi2 in the same manner, described above, in which the impedance Zmi1 is generated from the voltage reflection coefficient Γmi1. Moreover, the impedance Zmi2 is forward propagated via the match network model 102 to generate the load impedance ZL2 at the output 144 of the match network model 102 in the same manner in which the load impedance ZL1 is generated at the output 144 from the impedance Zmi1 at the input 142 of the match network model 102.

Figure 4:
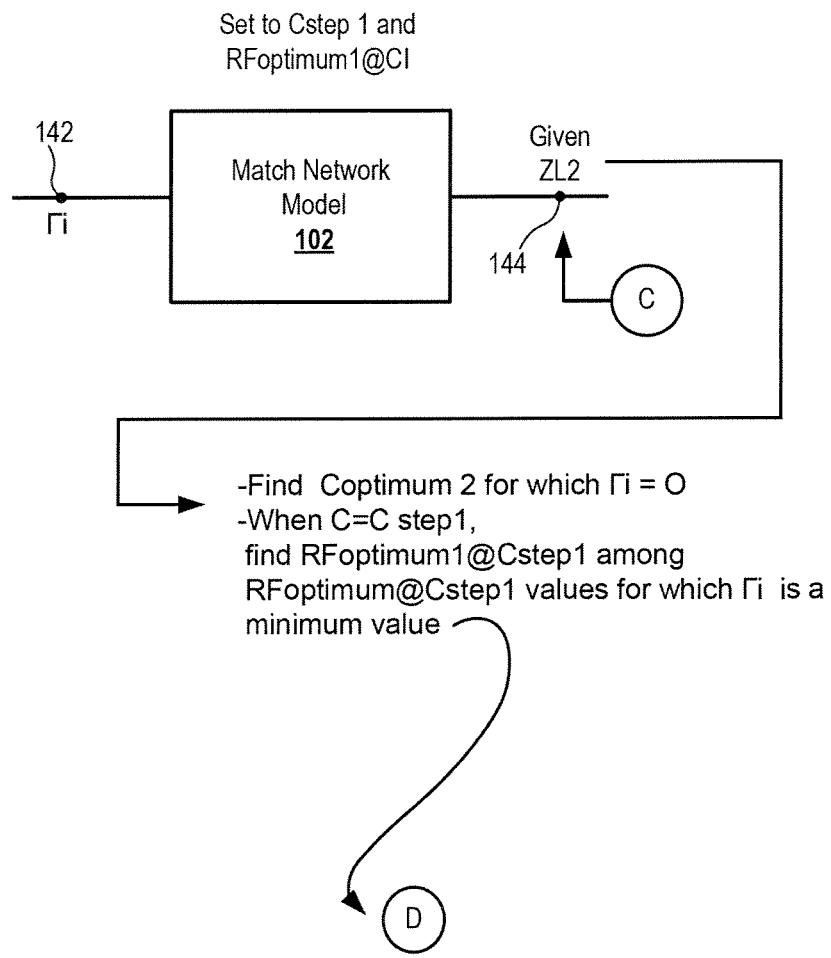
FIG. 4 is a diagram of an embodiment of the match network model that is set to the radio frequency RFoptimum1@C1 and the combined variable capacitance Cstep1 to generate a minimum value of the reflection coefficient Γi at the input of the match network model.

FIG. 4 is a diagram of an embodiment of the match network model 102 that is set to the radio frequency RFoptimum1@C1 and the combined variable capacitance Cstep1 to generate a minimum value of the voltage reflection coefficient Γi at the input 142. For example, the processor 134 applies the radio frequency RFoptimum1@C1 and the combined variable capacitance Cstep1 to the match network model 102. As another example, the processor 134 sets values of parameters of the match network model 102 as having the value RFoptimum1@C1 of radio frequency and the value Cstep1 of combined variable capacitance.

In the same manner described above for calculating the combined variable capacitance Coptimum1, the processor 134 calculates from the load impedance ZL2 and the match network model 102 a combined variable capacitance value Coptimum2 for which the voltage reflection coefficient Γi is zero. The processor 134 varies radio frequency values applied to the match network model 102 from RFoptimum1@Cstep1 to RFoptimumn@Cstep1 and back propagates the load impedance ZL2 to determine a radio frequency RFoptimum1@Cstep1 for which the voltage reflection coefficient Γi is a minimum, where n is an integer greater than 1. For example, the processor 134 back propagates the impedance ZL2 via the match network model 102 having the variable capacitance Cstep1 when the match network model 102 has the radio frequency RFoptimum1@Cstep1 to determine that the voltage reflection coefficient Γi has a first value. Moreover, in the example, the processor 134 back propagates the impedance ZL2 via the match network model 102 having the variable capacitance Cstep1 when the match network model 102 has the radio frequency RFoptimum2@Cstep1 to determine that the voltage reflection coefficient Γi has a second value. The processor 134 determines that the first value is a minimum of the first and second values to further determine that the RFoptimum1@Cstep1 is a radio frequency value for which the voltage reflection coefficient Γi is a minimum.

Figure 5:
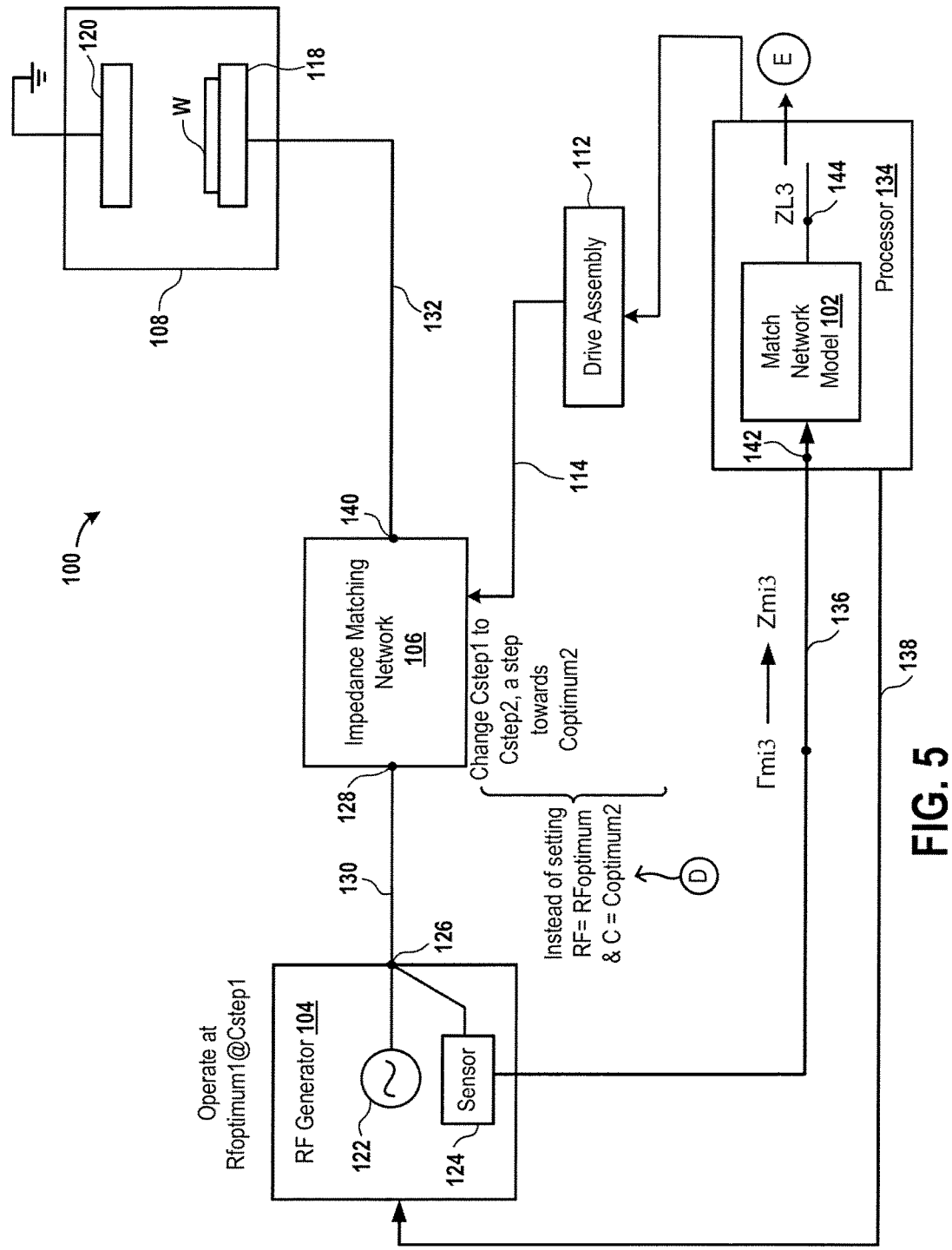
FIG. 5 is a diagram of an embodiment of the plasma system to illustrate use of a capacitance value Coptimum2 to generate another step combined variable capacitance value Cstep2, and use of a value RFoptimum1@Cstep1 to generate a load impedance ZL3.

FIG. 5 is a diagram of an embodiment of the system 100 to illustrate use of the capacitance value Coptimum2 to generate another step combined variable capacitance value Cstep2, and use of the value RFoptimum1@Cstep1 to generate a load impedance ZL3. The processor 134 modifies the recipe to include the radio frequency value RFoptimum1@Cstep1 and provides the radio frequency value RFoptimum1@Cstep1 to the RF generator 104. Moreover, the processor 134 determines a step variable capacitance value Cstep2 that is one additional step in a direction of the value Coptimum2 from the value Cstep1. For example, among the variable capacitance values Cstep1, Cstep2, and Coptimum2, the variable capacitance value Cstep2 is greater than the value Cstep1 and less than the value Coptimum2, and the values Cstep2 and Cstep1 are greater than the value C1. As another example, among the variable capacitance values Cstep1, Cstep2, and Coptimum2, the variable capacitance value Cstep2 is less than the value Cstep1 and greater than the value Coptimum2, and the values Cstep1 and Cstep2 are less than the value C1.

Instead of setting the combined variable capacitance of the impedance matching network 106 at the value Coptimum2 and instead of setting the RF generator 104 to generate the RF signal having the radio frequency RFoptimum, the processor 134 controls the drive assembly 112 so that the combined variable capacitance of the impedance matching network 106 is set at the value Cstep2 and controls the RF generator 104 to operate at the radio frequency RFoptimum1@Cstep1. For the radio frequency RFoptimum1 @Cstep1 and the variable capacitance Cstep2, the RF generator 104 generates the RF signal having the radio frequency RFoptimum1 @Cstep1, which passes via the impedance matching network 106 to generate a modified signal, which is provided to the lower electrode of the chuck 118. For the radio frequency RFoptimum1 @Cstep1 and the variable capacitance Cstep2, the sensor 124 measures a voltage reflection coefficient Γmi3 at the output 126 and the processor 134 generates an impedance Zmi3 from the voltage reflection coefficient in the same manner in which the impedance Zmi1 is generated from the voltage reflection coefficient Γmi1. Moreover, the impedance Zmi3 is forward propagated via the match network model 102 to generate a load impedance ZL3 at the output 144 of the match network model 102 in the same manner in which the load impedance ZL1 is generated at the output 144 from the impedance Zmi1 at the input 142 of the match network model 102.

In some embodiments, the radio frequency RFoptimum1@Cstep1 is equal to the optimum radio frequency value RFoptimum and the combined variable capacitance of Cstep2 is equal to the value Coptimum2. In these embodiments, the operations described below with reference to FIGS. 6 through 9 are not performed.

Figure 6:
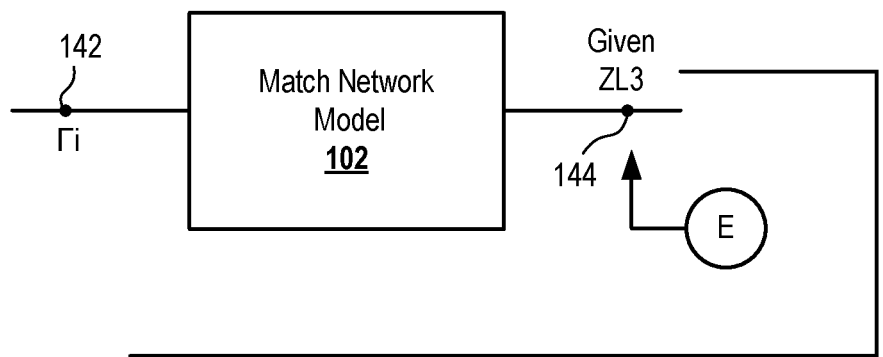
FIG. 6 is a diagram of an embodiment of the match network model that is set to the radio frequency RFoptimum1@Cstep1 and the combined variable capacitance Cstep2 to generate a minimum value of the reflection coefficient at the input of the match network model.

FIG. 6 is a diagram of an embodiment of the match network model 102 that is set to the radio frequency RFoptimum1@Cstep1 and the combined variable capacitance Cstep2 to generate a minimum value of the voltage reflection coefficient Γi at the input 142. In the same manner described above for calculating the combined variable capacitance Coptimum1, the processor 134 calculates from the load impedance ZL3 and the match network model 102 a combined variable capacitance value Coptimum3 for which the voltage reflection coefficient Γi is zero.

Moreover, the processor 134 varies radio frequency values applied to the match network model 102 from RFoptimum1@Cstep2 to RFoptimumn@Cstep2 and back propagates the load impedance ZL3 to determine the radio frequency RFoptimum1@Cstep2 for which the voltage reflection coefficient Γi is a minimum, where n is an integer greater than 1. For example, the processor 134 back propagates the impedance ZL3 via the match network model 102 having the combined variable capacitance Cstep2 when the match network model 102 has the radio frequency RFoptimum1@Cstep2 to determine that the voltage reflection coefficient Γi has a first value. Moreover, in the example, the processor 134 back propagates the impedance ZL3 via the match network model 102 having the combined variable capacitance Cstep2 when the match network model 102 has the radio frequency RFoptimum2@Cstep2 to determine that the voltage reflection coefficient Γi has a second value. The processor 134 determines that the first value is a minimum of the first and second values to further determine that the RFoptimum1@Cstep2 is a radio frequency value for which the voltage reflection coefficient Γi is a minimum.

In some embodiments, any of the capacitance values Coptimum2 and Coptimum3 is equal to the capacitance value Coptimum1 for which the voltage reflection coefficient Γi is zero.

Figure 7:
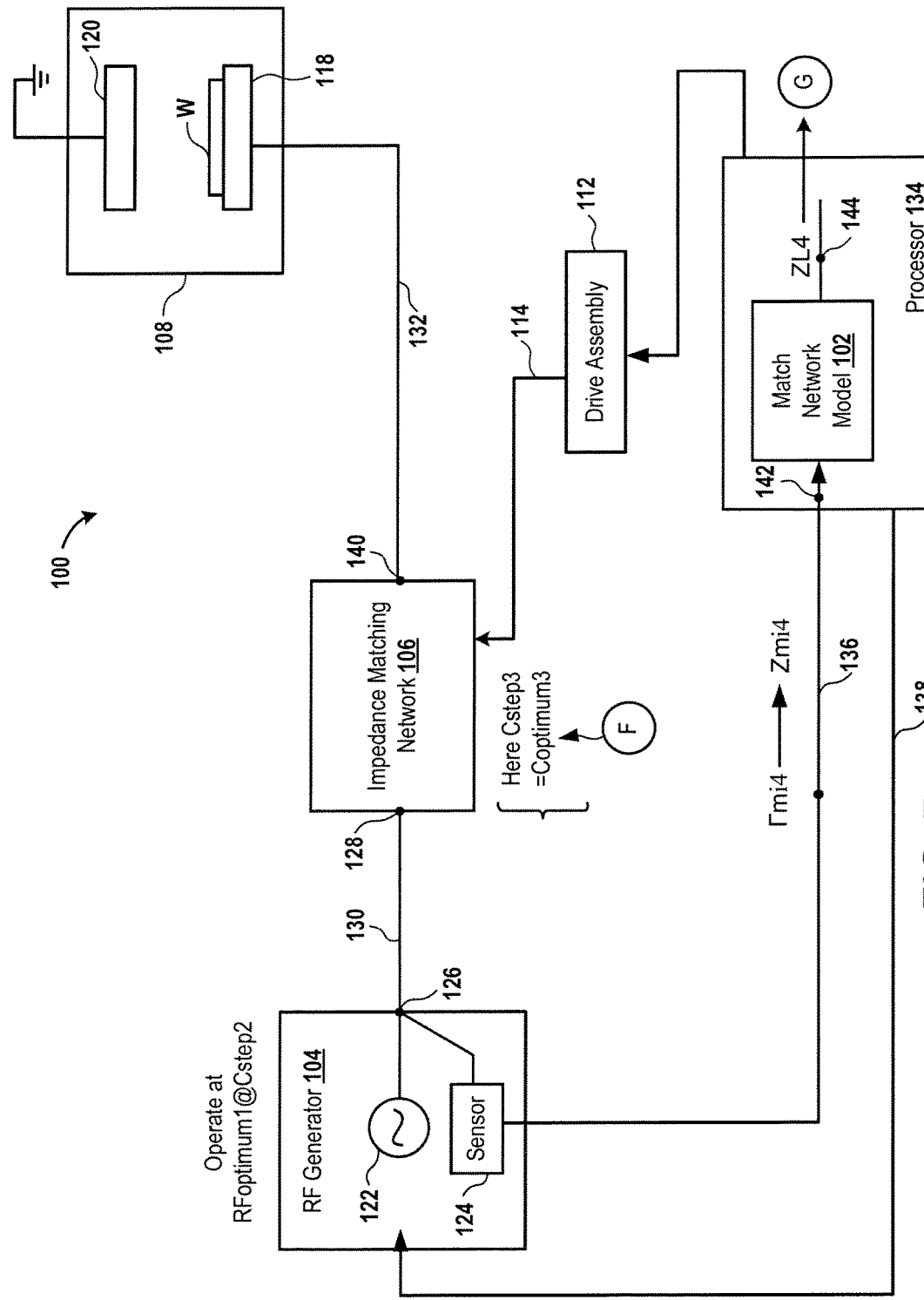
FIG. 7 is a diagram of an embodiment of the plasma system to illustrate use of a capacitance value Coptimum3, and use of a value RFoptimum1@Cstep2 to generate a load impedance ZL4.

FIG. 7 is a diagram of an embodiment of the plasma system 100 to illustrate use of the capacitance value Coptimum3, and use of the value RFoptimum1@Cstep2 to generate a load impedance ZL4. The processor 134 modifies the recipe to include the radio frequency value RFoptimum1@Cstep2 and provides the radio frequency value RFoptimum1@Cstep2 to the RF generator 104. Moreover, the processor 134 determines a step variable capacitance value Cstep3 that is one additional step in the direction of the value Coptimum3 from the value Cstep2. For example, the value Cstep3 is the value Coptimum3. To further illustrate, among the variable capacitance values Cstep1, Cstep2, and Coptimum3, the variable capacitance value Coptimum3 is greater than the value Cstep2, and the value Cstep2 is greater than the value Cstep1, which is greater than the capacitance value C1. As another illustration, among the variable capacitance values Cstep1, Cstep2, and Coptimum3, the variable capacitance value Coptimum3 is less than the value Cstep2, which is less than the value Cstep1, and the value Cstep1 is less than the value C1.

The processor 134 controls the drive assembly 112 so that the combined variable capacitance of the impedance matching network 106 is set at the value Coptimum3. Moreover, instead of setting the RF generator 104 to generate the RF signal having the radio frequency RFoptimum, the processor 134 controls the RF generator 104 to operate at the radio frequency RFoptimum1@Cstep2.

For the radio frequency RFoptimum1@Cstep2 and the variable capacitance Coptimum3, the RF generator 104 generates the RF signal having the radio frequency RFoptimum1@Cstep2, which passes via the impedance matching network 106 to generate a modified signal, which is provided to the lower electrode of the chuck 118. For the radio frequency RFoptimum1@Cstep2 and the variable capacitance Coptimum3, the sensor 124 measures a voltage reflection coefficient Γmi4 at the output 126 and the processor 134 generates an impedance Zmi4 from the voltage reflection coefficient Γmi4 in the same manner in which the impedance Zmi1 is generated from the voltage reflection coefficient Γmi1. Moreover, the impedance Zmi4 is forward propagated via the match network model 102 to generate the load impedance ZL4 at the output 144 of the match network model 102 in the same manner in which the load impedance ZL1 is generated at the output 144 from the impedance Zmi1 at the input 142 of the match network model 102.

In some embodiments, the value RFoptimum1@Cstep2 is equal to the radio frequency value RFoptimum. In these embodiments, the operations described below with reference to FIGS. 8 and 9 are not performed.

In various embodiments, each of the optimum values Coptimum1, Coptimum2, and Coptimum3 is obtained after the processor 134 is programmed to be constrained to calculate an optimum capacitance value that is within pre-determined capacitance value boundaries. For example, the processor 134 is programmed to determine the optimum capacitance value Coptimum1 in a manner described above with respect to FIG. 2 except that the capacitance value Coptimum1 is between upper and lower pre-determined limits. The pre-determined boundaries are the same as operational boundaries of one or more variable capacitors of the impedance matching network 106 (FIG. 1). For example, the one or more variable capacitors are physically incapable of operating outside the operational boundaries. As another example, the processor 134 is programmed to determine the optimum capacitance value Coptimum2 in a manner described above with respect to FIG. 4 except that the capacitance value Coptimum2 is between the upper and lower pre-determined limits. As yet another example, the processor 134 is programmed to determine the optimum capacitance value Coptimum3 in a manner described above with respect to FIG. 6 except that the capacitance value Coptimum3 is between the upper and lower pre-determined limits.

In some embodiments, each of the values RFoptimum1@C1, RFoptimum1@Cstep1, RFoptimum1@Cstep2, and RFoptimum1@Coptimum is obtained after the processor 134 is programmed to be constrained to calculate an optimum RF value that is within pre-determined limits. For example, the processor 134 is programmed to determine the RF value RFoptimum1@C1 in a manner described above with respect to FIG. 2 except that the RF value RFoptimum1@C1 is between upper and lower pre-determined boundaries. The pre-determined limits are the same as operational boundaries of the RF generator 104 (FIG. 1). For example, the RF generator 104 is physically incapable of operating outside the operational boundaries. As another example, the processor 134 is programmed to determine the RF value RFoptimum1@Cstep1 in a manner described above with respect to FIG. 4 except that the RF value RFoptimum1@Cstep1 is between the upper and lower pre-determined boundaries. As yet another example, the processor 134 is programmed to determine the optimum RF value RFoptimum1@Cstep2 in a manner described above with respect to FIG. 6 except that the RF value RFoptimum1@Cstep2 is between the upper and lower pre-determined boundaries. As another example, the processor 134 is programmed to determine the optimum RF value RFoptimum1@Coptimum in a manner described above with respect to FIG. 8 except that the RF value RFoptimum1@Coptimum is between the upper and lower pre-determined boundaries.

Figure 8:
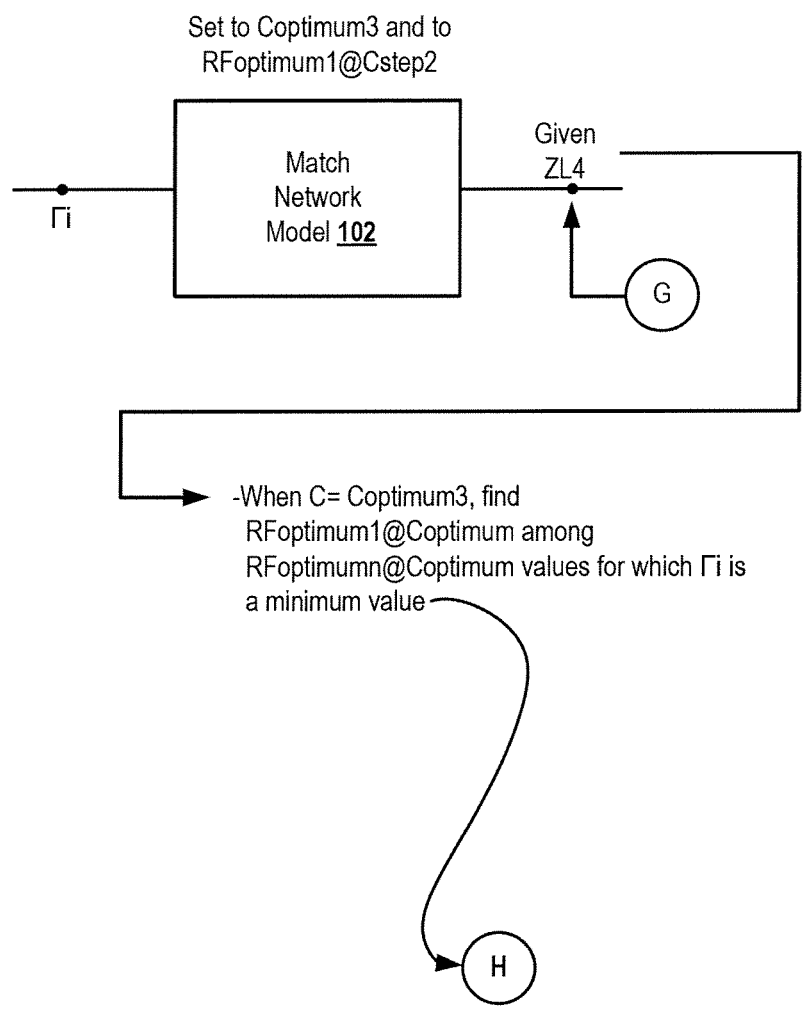
FIG. 8 is a diagram of an embodiment of the match network model that is set to the radio frequency RFoptimum1@Cstep2 and the combined variable capacitance Coptimum3 to generate a minimum value of the reflection coefficient at the input of the match network model.
Figure 9:
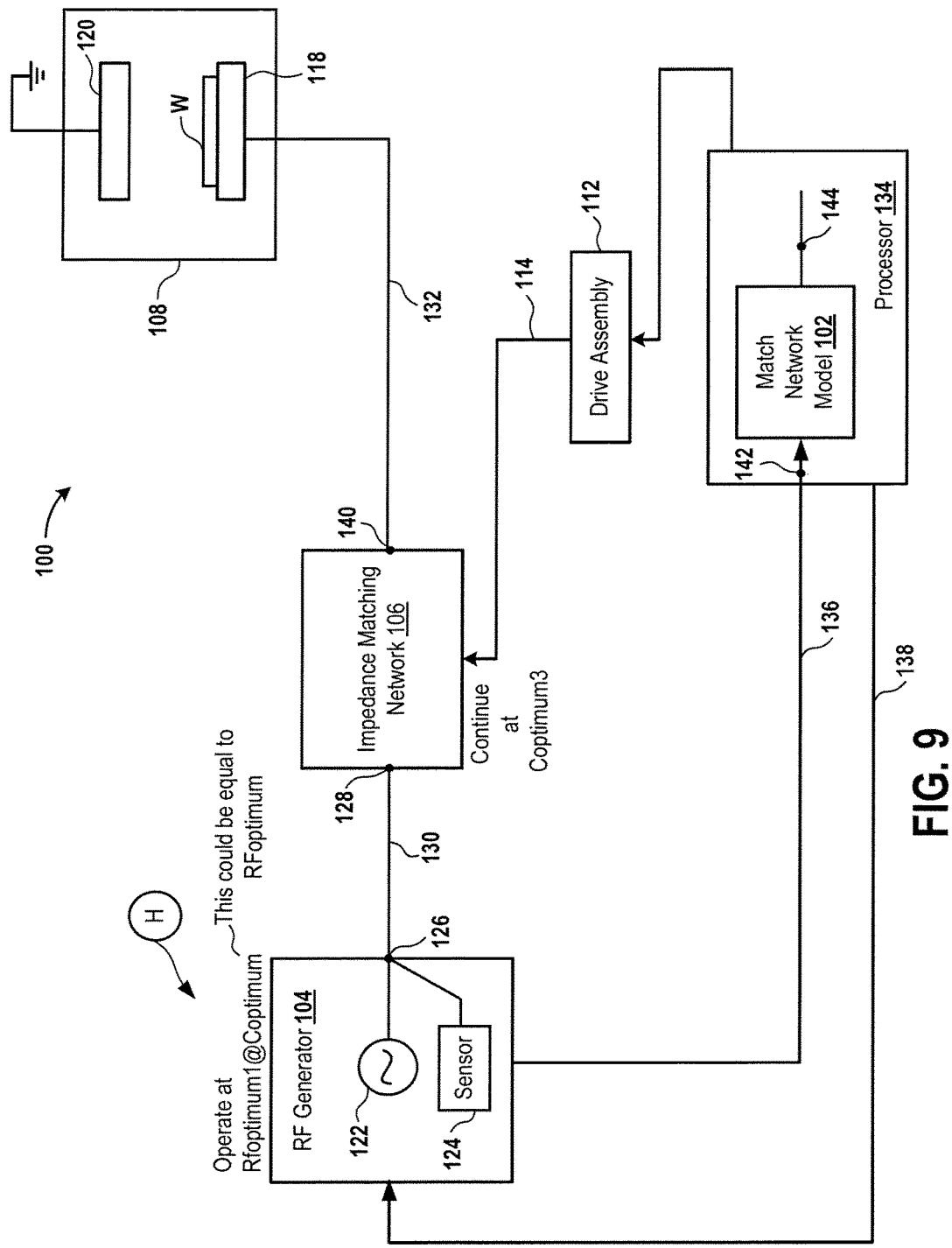
FIG. 9 is a diagram of an embodiment of the plasma system to illustrate use of the capacitance value Coptimum3, and use of a value RFoptimum1@Coptimum to process a wafer W.

FIG. 8 is a diagram of an embodiment of the match network model 102 that is set to the radio frequency RFoptimum1@Cstep2 and the combined variable capacitance Coptimum3 to generate a minimum value of the voltage reflection coefficient Γi at the input 142. The processor 134 varies radio frequency values applied to the match network model 102 from RFoptimum1@Coptimum to RFoptimumn@Coptimum and back propagates the load impedance ZL4 to determine the radio frequency RFoptimum1@Coptimum for which the voltage reflection coefficient Γi is a minimum, where n is an integer greater than 1. For example, the processor 134 back propagates the load impedance ZL4 via the match network model 102 having the variable capacitance Coptimum3 when the match network model has the radio frequency RFoptimum1@Cstep2 to determine that the voltage reflection coefficient Γi has a first value. Moreover, in the example, the processor 134 back propagates the load impedance ZL4 via the match network model 102 having the variable capacitance Coptimum3 when the match network model has the radio frequency RFoptimum2@Cstep2 to determine that the voltage reflection coefficient Γi has a second value. The processor 134 determines that the first value is a minimum of the first and second values to further determine that the RFoptimum1@Coptimum is a radio frequency value for which the voltage reflection coefficient Γi is a minimum.

In some embodiments, the value RFoptimum1@Coptimum is equal to the value RFoptimum.

FIG. 9 is a diagram of an embodiment of the system 100 to illustrate use of the capacitance value Coptimum3, and use of the value RFoptimum1@Coptimum to process the wafer W. The processor 134 modifies the recipe to include the radio frequency value RFoptimum1@Coptimum and provides the radio frequency value RFoptimum1@Coptimum to the RF generator 104. Moreover, the processor 134 continues to control the drive assembly 112 so that the combined variable capacitance of the impedance matching network 106 is set at the value Coptimum3. Moreover, instead of setting the RF generator 104 to generate the RF signal having the radio frequency RFoptimum, the processor 134 controls the RF generator 104 to operate at the radio frequency RFoptimum1 @ Coptimum.

For the radio frequency RFoptimum1@Coptimum and the variable capacitance Coptimum3, the RF generator 104 generates the RF signal having the radio frequency RFoptimum1@Coptimum, which passes via the impedance matching network 106 to generate a modified signal, which is provided to the lower electrode of the chuck 118 for processing the wafer W. In this manner, instead of applying the radio frequency RFoptimum directly from the radio frequency RF1 and instead of applying the combined variable capacitance value Coptimum1 directly from the combined variable capacitance value C1, a step approach in which the combined variable capacitance value Cstep1 is applied with the radio frequency RFoptimum1 @C1 first, followed by applying the combined variable capacitance value Cstep1 with the radio frequency RFoptimum1@C1 first, then followed by applying the combined variable capacitance value Cstep2 with the radio frequency RFoptimum1@Cstep1 second, and then followed by applying the combined variable capacitance value Coptimum3 with the radio frequency RFoptimum1@Cstep2 third, and lastly followed by applying the combined variable capacitance value Coptimum3 with the radio frequency RFoptimum1 @Coptimum. For example, the application of the combined variable capacitance value Coptimum3 and the radio frequency RFoptimum1@Cstep2 precedes the application of the combined variable capacitance value Coptimum3 with the radio frequency RFoptimum1 @Coptimum. Moreover, the application of the combined variable capacitance value Cstep2 and the radio frequency RFoptimum1 @Cstep1 precedes the application of the combined variable capacitance value Coptimum3 and the radio frequency RFoptimum1@Cstep2. Also, the application of the combined variable capacitance value Cstep1 and the radio frequency RFoptimum1 @C1 precedes the application of the combined variable capacitance value Cstep2 and the radio frequency RFoptimum1 @Cstep1.

In some embodiments, instead of applying the radio frequency RFoptimum directly from the radio frequency RF1 and instead of applying the combined variable capacitance value Coptimum1 directly from the combined variable capacitance value C1, a step approach in which the combined variable capacitance value Cstep1 is applied with the radio frequency RFoptimum1@C1 first (see FIG. 3), followed by applying the combined variable capacitance value Cstep2 with the radio frequency RFoptimum1@Cstep1 second (see FIG. 5), then followed by applying the combined variable capacitance value Coptimum3 with the radio frequency RFoptimum1@Cstep2 third (see FIG. 7), and then lastly followed by applying the combined variable capacitance value Coptimum3 with the radio frequency RFoptimum1@Coptimum (see FIG. 9).

In some embodiments, instead of generating an impedance, e.g., the impedance Zmi1, etc., from a voltage reflection coefficient, e.g., Γmi1, Γmi2, Γmi3, Γmi4, etc., received from the sensor 124, the processor 134 receives the voltage reflection coefficient to generate a corresponding load voltage reflection coefficient impedance, e.g., ΓL1, ΓL2, ΓL3, ΓL4, etc., at the output 144 of the match network model 102. There is no need to convert from a voltage reflection coefficient to impedance and vice versa.

In various embodiments, instead of the match network model 102, a combination of the match network model 102 and an RF transmission model is used to change capacitance of the impedance matching network 106 in the step-wise fashion, as described herein. For example, the load impedances ZL1, ZL2, ZL3, and ZL4 are calculated at an output of the RF transmission model instead of at the output 144 of the match network model 102. As another example, instead of using the match network model 102 in FIGS. 2, 4, 6, and 8, both the match network model 102 and the RF transmission model are used. The RF transmission model is connected in series to the output 144 of the match network model 102 and is derived from the RF transmission line 132 in a similar manner in which the match network model 102 is derived from the impedance matching network 106. For example, the RF transmission model has inductances, capacitances, and/or resistances that are derived from inductances, capacitances, and/or resistances of the RF transmission line 132. As another example, a capacitance of the RF transmission model matches a capacitance of the RF transmission line 132, an inductance of the RF transmission model matches an inductance of the RF transmission line 132, and a resistance of RF transmission model matches a resistance of the RF transmission line 132.

In some embodiments, instead of the match network model 102, a combination of an RF cable model, the match network model 102, and an RF transmission model is used to change capacitance of the impedance matching network 106 in the step-wise fashion, as described herein. For example, the load impedances ZL1, ZL2, ZL3, and ZL4 are calculated at an output of the RF transmission model instead of at the output 144 of the match network model 102. As another example, instead of using the match network model 102 in FIGS. 2, 4, 6, and 8, the RF cable model, the match network model 102, and the RF transmission model are used. The RF cable model is connected in series to the input 142 of the match network model 102 and is derived from the RF cable 130 in a similar manner in which the match network model 102 is derived from the impedance matching network 106. For example, the RF cable model has inductances, capacitances, and/or resistances that are derived from inductances, capacitances, and/or resistances of the RF cable 130. As another example, a capacitance of the RF cable model matches a capacitance of the RF cable 130, an inductance of the RF cable model matches an inductance of the RF cable 130, and a resistance of RF cable model matches a resistance of the RF cable 130.

Figure 10:
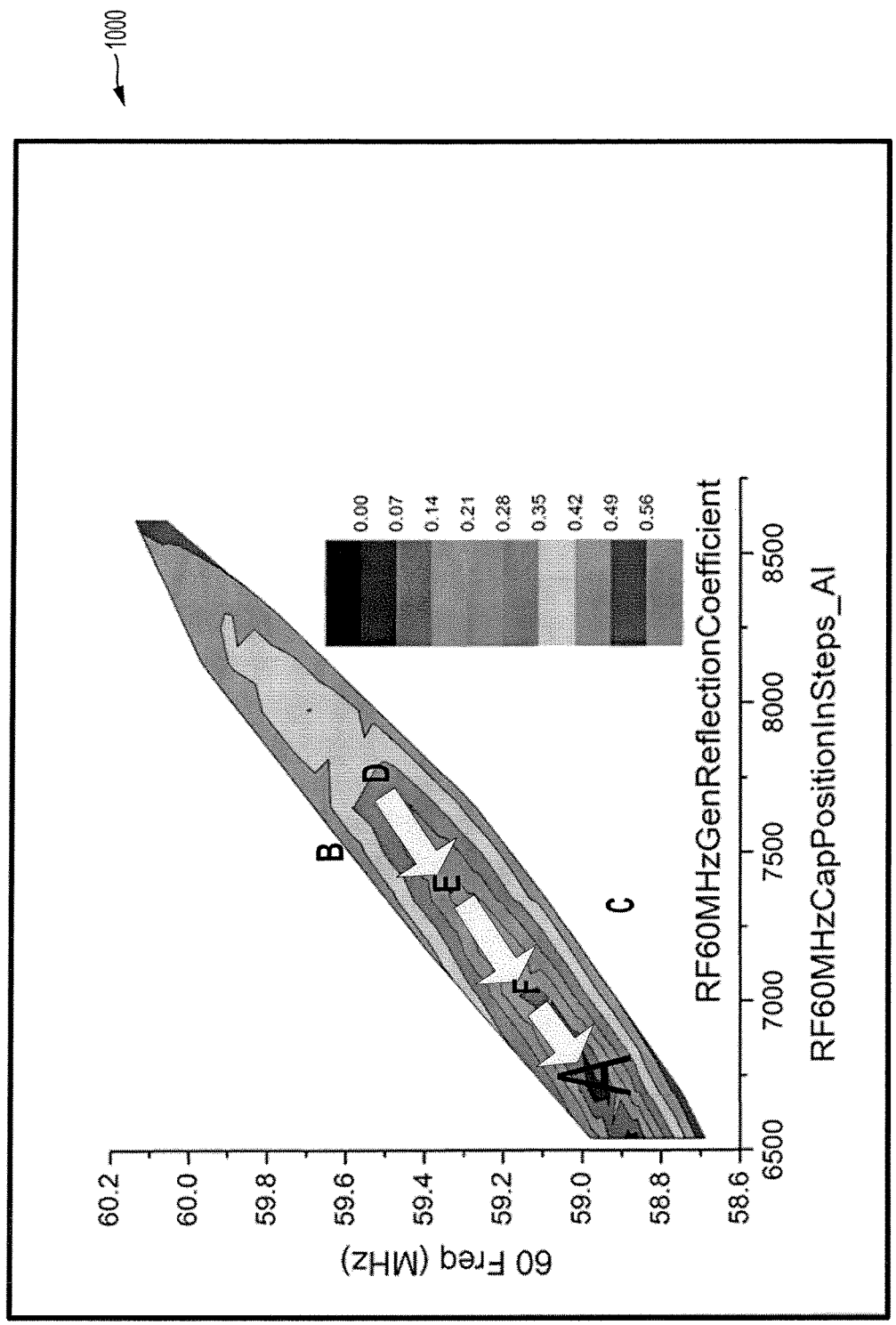
FIG. 10 is an embodiment of a graph to illustrate step-wise tuning of the impedance matching network and of an RF generator of the plasma system.

FIG. 10 is an embodiment of a graph 1000 to illustrate step-wise tuning of the impedance matching network 106 and of the RF generator 104. The graph 1000 plots a frequency of an RF signal generated by the RF generator 104 versus a combined variable capacitance of the impedance matching network 106. The graph 1000 plots representative contours of a voltage reflection coefficient $\Gamma$ as a function of the combined variable capacitance of the impedance matching network 106 and frequency of the RF signal generated by the RF generator 104. Starting at a point B, where a magnitude of the voltage reflection coefficient is approximately equal to 0.5, the match network model 102 indicates that an optimum tune point is A, where magnitude of F is approximately equal to zero and value of resistance at the output 126 (FIG. 1) is 50 ohms. If the combined variable capacitance of the impedance matching network 106 and the frequency of the RF signal generated by the RF generator 104 are changed at maximum achievable rates, the frequency drops very quickly to a point C, where the magnitude of voltage reflection coefficient $\Gamma$ is much worse, before the slower variable capacitance of the impedance matching network 106 has a chance to move. In the step-wise tuning, the combined variable capacitance of the impedance matching network 106 is changed from the point B to the point A but via points D, E, and F, and the frequency of the RF signal is tuned for each of the variable capacitances at the points D, E, and F. At each of the points D, E, and F, a local optimum frequency of the RF signal for a minimum magnitude of the voltage reflection coefficient $\Gamma$ is determined.

It should be noted that in some of the above-described embodiments, an RF signal is supplied to the lower electrode of the chuck 118 and the upper electrode 116 is grounded. In various embodiments, an RF signal is applied to the upper electrode 116 and the lower electrode of the chuck 118 is grounded.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSP)s, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP)

reactor, a transformer coupled plasma (TCP) reactor, conductor tools, dielectric tools, a plasma chamber including an electron cyclotron resonance (ECR) reactor, etc. For example, the x MHz RF generator, the y MHz RF generator, and the z MHz RF generator are coupled to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for tuning an impedance matching network in a step-wise fashion, comprising:

receiving a first measured input parameter value sensed between an output of a radio frequency (RF) generator and an input of the impedance matching network when the RF generator operates at a first parametric value and the impedance matching network has a first variable measurable factor, wherein the first measured input parameter value is received from a sensor that is located within the RF generator and coupled to the output of the RF generator;

initializing one or more computer-generated models to have the first variable measurable factor and the first parametric value, wherein the one or more computer-generated models include a match network model of the impedance matching network;

propagating the first measured input parameter value via the one or more computer-generated models to output a first output parameter value, wherein said propagating the first measured input parameter value is performed when the one or more computer-generated models have the first variable measurable factor and the first parametric value;

determining, using the first output parameter value and the one or more computer-generated models, an optimum parametric value and an optimum variable measurable factor for which a reflection coefficient at an input of the one or more computer-generated models is zero;

determining, using the first output parameter value and the one or more computer-generated models, a first intermediate parametric value for which the reflection coefficient at the input of the one or more computer-generated models is at a minimum;

operating the RF generator at the first intermediate parametric value; and setting the impedance matching network to have a first step variable measurable factor, wherein the first step variable measurable factor is closer to the optimum variable measurable factor compared to the first variable measurable factor so that the impedance matching network is tuned in the step-wise fashion.

2. The method of claim 1, further comprising:

receiving a second measured input parameter value sensed between the output of the RF generator and the input of the impedance matching network when the RF generator is operated at the first intermediate parametric value and the impedance matching network is set to have the first step variable measurable factor;

setting the one or more computer-generated models to have the first step variable measurable factor and the first intermediate parametric value;

computing a second output parameter value using the one or more computer-generated models from the second measured input parameter value when the one or more computer-generated models have the first step variable measurable factor and the first intermediate parametric value;

computing, using the second output parameter value and the one or more computer-generated models, a second intermediate parametric value for which the reflection coefficient at the input of the one or more computer-generated models is at a minimum;
operating the RF generator at the second intermediate parametric value; and
setting the impedance matching network to have a second step variable measurable factor.

3. The method of claim 2, wherein the second intermediate parametric value is the optimum parametric value.

4. The method of claim 2, further comprising:
receiving a third measured input parameter value sensed between the output of the RF generator and the input of the impedance matching network when the RF generator is operated at the second intermediate parametric value and the impedance matching network is set to have the second step variable measurable factor;
setting the one or more computer-generated models to have the second step variable measurable factor and the second intermediate parametric value;
computing a third output parameter value using the one or more computer-generated models from the third measured input parameter value;
computing, using the third output parameter value and the one or more computer-generated models, a third intermediate parametric value for which the reflection coefficient at the input of the one or more computer-generated models is at a minimum; and
operating the RF generator at the third intermediate parametric value.

5. The method of claim 4, wherein the third intermediate parametric value is the optimum parametric value.

6. The method of claim 4, wherein the third intermediate value is different from the optimum parametric value.

7. The method of claim 1, wherein the first measured input parameter value is an impedance or a reflection coefficient.

8. The method of claim 1, wherein the first output parameter value is calculated by forward propagating the first measured input parameter value via circuit elements of the one or more computer-generated models.

9. The method of claim 1, wherein the optimum parametric value and the optimum variable measurable factor are computed by back propagating the first output parameter value via circuit elements of the one or more computer-generated models to achieve the zero reflection coefficient.

10. A system for tuning an impedance matching network in a step-wise fashion, comprising:
a processor configured to receive a first measured input parameter value sensed between an output of a radio frequency (RF) generator and an input of the impedance matching network when the RF generator operates at a first parametric value and the impedance matching network has a first variable measurable factor,
wherein the first measured input parameter value is received by the processor from a sensor that is located within the RF generator and coupled to the output of the RF generator,
wherein the processor is configured to initialize one or more computer-generated models to have the first variable measurable factor and the first parametric value, wherein the one or more computer-generated models include a model of the impedance matching network; and
a memory device connected to the processor, wherein the memory device is configured to store the one or more computer-generated models,
wherein the processor is configured to propagate the first measured input parameter value via the one or more computer-generated models to output a first output parameter value, wherein the processor is configured to propagate the first measured input parameter value when the one or more computer-generated models have the first variable measurable factor and the first parametric value, wherein the processor is configured to determine, using the first output parameter value and the one or more computer-generated models, an optimum parametric value and an optimum variable measurable factor for which a reflection coefficient at an input of the one or more computer-generated models is zero;
wherein the processor is configured to determine, using the first output parameter value and the one or more computer-generated models, a first intermediate parametric value for which the reflection coefficient at the input of the one or more computer-generated models is at a minimum,
wherein the processor is configured to operate the RF generator at the first intermediate parametric value,
wherein the processor is configured to set the impedance matching network to have a first step variable measurable factor, wherein the first step variable measurable factor is closer to the optimum variable measurable factor compared to the first variable measurable factor so that the impedance matching network is tuned in the step-wise fashion.

11. The system of claim 10,
wherein the processor is configured to receive a second measured input parameter value sensed between the output of the RF generator and the input of the impedance matching network when the RF generator is operated at the first intermediate parametric value and the impedance matching network is set to have the first step variable measurable factor,
wherein the processor is configured to set the one or more computer-generated models to have the first step variable measurable factor and the first intermediate parametric value,
wherein the processor is configured to compute a second output parameter value using the one or more computer-generated models from the second measured input parameter value when the one or more computer-generated models have the first step variable measurable factor and the first intermediate parametric value,
wherein the processor is configured to compute, using the second output parameter value and the one or more computer-generated models, a second intermediate parametric value for which the reflection coefficient at the input of the one or more computer-generated models is at a minimum,
wherein the processor is configured to operate the RF generator at the second intermediate parametric value, and
wherein the processor is configured to set the impedance matching network to have a second step variable measurable factor.

12. The system of claim 11,
wherein the processor is configured to receive a third measured input parameter value sensed between the output of the RF generator and the input of the impedance matching network when the RF generator is operated at the second intermediate parametric value and the impedance matching network is set to have the second step variable measurable factor, wherein the processor is configured to set the one or more computer-generated models to have the second step variable measurable factor and the second intermediate parametric value, wherein the processor is configured to compute a third output parameter value using the one or more computer-generated models from the third measured input parameter value, wherein the processor is configured to compute, using the third output parameter value and the one or more computer-generated models, a third intermediate parametric value for which the reflection coefficient at the input of the one or more computer-generated models is at a minimum, and wherein the processor is configured to operate the RF generator at the third intermediate parametric value.

13. The system of claim 12, wherein the third intermediate parametric value is the optimum parametric value.

14. The system of claim 12, wherein the third intermediate parametric value is different from the optimum parametric value.

15. The system of claim 10, wherein the first measured input parameter value is an impedance or a reflection coefficient.

16. A system for tuning an impedance matching network in a step-wise fashion, comprising:
a radio frequency (RF) generator having an output;
the impedance matching network connected to the output of the RF generator;
a plasma chamber connected to the impedance matching network via an RF transmission line; and
a processor coupled to the RF generator,
wherein the processor is configured to receive a first measured input parameter value sensed between the output of the RF generator and an input of the impedance matching network when the RF generator operates at a first parametric value and the impedance matching network has a first variable measurable factor,
wherein the first measured input parameter value is received by the processor from a sensor that is located within the RF generator and coupled to the output of the RF generator,
wherein the processor is configured to initialize one or more computer-generated models to have the first variable measurable factor and the first parametric value, wherein the one or more computer-generated models include a match network model of the impedance matching network,
wherein the processor is configured to propagate the first measured input parameter value via the one or more computer-generated models to output a first output parameter value, wherein the processor is configured to propagate the first measured input parameter value when the one or more computer-generated models have the first variable measurable factor and the first parametric value,
wherein the processor is configured to determine, using the first output parameter value and the one or more computer-generated models, an optimum parametric value and an optimum variable measurable factor for which a reflection coefficient at an input of the one or more computer-generated models is zero;
wherein the processor is configured to determine, using the first output parameter value and the one or more computer-generated models, a first intermediate parametric value for which the reflection coefficient at the input of the one or more computer-generated models is at a minimum, wherein the processor is configured to operate the RF generator at the first intermediate parametric value, wherein the processor is configured to set the impedance matching network to have a first step variable measurable factor, wherein the first step variable measurable factor is closer to the optimum variable measurable factor compared to the first variable measurable factor so that the impedance matching network is tuned in the step-wise fashion.

17. The system of claim 16,
wherein the processor is configured to receive a second measured input parameter value sensed between the output of the RF generator and the input of the impedance matching network when the RF generator is operated at the first intermediate parametric value and the impedance matching network is set to have the first step variable measurable factor, wherein the processor is configured to set the one or more computer-generated models to have the first step variable measurable factor and the first intermediate parametric value, wherein the processor is configured to compute a second output parameter value using the one or more computer-generated models from the second measured input parameter value when the one or more computer-generated models have the first step variable measurable factor and the first intermediate parametric value, wherein the processor is configured to compute, using the second output parameter value and the one or more computer-generated models, a second intermediate parametric value for which the reflection coefficient at the input of the one or more computer-generated models is at a minimum, wherein the processor is configured to operate the RF generator at the second intermediate parametric value, and wherein the processor is configured to set the impedance matching network to have a second step variable measurable factor.

18. The system of claim 17,
wherein the processor is configured to receive a third measured input parameter value sensed between the output of the RF generator and the input of the impedance matching network when the RF generator is operated at the second intermediate parametric value and the impedance matching network is set to have the second step variable measurable factor, wherein the processor is configured to set the one or more computer-generated models to have the second step variable measurable factor and the second intermediate parametric value, wherein the processor is configured to compute a third output parameter value using the one or more computer-generated models from the third measured input parameter value, wherein the processor is configured to compute, using the third output parameter value and the one or more computer-generated models, a third intermediate parametric value for which the reflection coefficient at the input of the one or more computer-generated models is at a minimum, and wherein the processor is configured to operate the RF generator at the third intermediate parametric value.

19. The system of claim 18, wherein the third intermediate parametric value is the optimum parametric value.

20. The system of claim 18, wherein the third intermediate parametric value is different from the optimum parametric value.

21. The system of claim 17, wherein the first measured input parameter value is an impedance or a reflection coefficient.

\* \* \* \* \*